US008111114B2

(12) United States Patent
Bhave et al.

(10) Patent No.: US 8,111,114 B2
(45) Date of Patent: Feb. 7, 2012

(54) MEMS FILTER WITH VOLTAGE TUNABLE CENTER FREQUENCY AND BANDWIDTH

(75) Inventors: Sunil Bhave, Ithaca, NY (US); Lih Feng Cheow, Perak (MY)

(73) Assignee: Cornell Center for Technology, Enterprise & Commericialization, Ithaca, NY (US)

( * ) Notice: Subject to any disclaimer, the term of this patent is extended or adjusted under 35 U.S.C. 154(b) by 463 days.

(21) Appl. No.: 12/299,341

(22) PCT Filed: May 2, 2007

(86) PCT No.: PCT/US2007/068018
§ 371 (c)(1), (2), (4) Date: Apr. 3, 2009

(87) PCT Pub. No.: WO2008/019179
PCT Pub. Date: Feb. 14, 2008

(65) Prior Publication Data

US 2009/0322448 A1 Dec. 31, 2009

Related U.S. Application Data

(60) Provisional application No. 60/746,210, filed on May 2, 2006.

(51) Int. Cl.
*H03H 9/46* (2006.01)
*H03H 3/013* (2006.01)

(52) U.S. Cl. ......................... 333/186; 333/188; 333/197

(58) Field of Classification Search .................. 333/186, 333/188, 197–200
See application file for complete search history.

(56) References Cited

U.S. PATENT DOCUMENTS 3,634,787 A * 1/1972 Newell .......................... 333/186
6,236,281 B1 * 5/2001 Nguyen et al. ................ 331/154
(Continued)

FOREIGN PATENT DOCUMENTS

JP 2004-112378 * 4/2004

OTHER PUBLICATIONS

Bhave et al.; "Silicon Nitride-On-Silicon Bar Resonator Using Internal Electrostatic Transduction"; Transducers '05, IEEE 13th International Conference on Solid-State Sensors, Actuators and Microsystems, Seoul, Korea, Jun. 5-9, 2005, pp. 2139-2142.*

(Continued)

*Primary Examiner* — Barbara Summons
(74) *Attorney, Agent, or Firm* — Heslin Rothenberg Farley & Mesiti P.C.

(57) ABSTRACT

A tunable MEMS filter is disclosed, having a substrate with first and second isolated substrate areas. First and second anchor points are coupled to the substrate. A base is coupled to the first and second anchor points by first and second coupling beams, respectively. A dielectric layer is coupled to the base. An input conductor is coupled to the at least one dielectric layer. An output conductor is coupled to the at least one dielectric layer.
A method of tuning a center frequency and a bandwidth of a MEMS resonator filter is also disclosed. A first bias voltage is adjusted between a base layer and input and output conductor layers. A second bias voltage is adjusted between the base layer and isolated substrate areas. The center frequency and the bandwidth are determined until the adjustments to the bias voltages provide a desired center frequency and a desired bandwidth.

10 Claims, 13 Drawing Sheets

U.S. PATENT DOCUMENTS

| | | | | |
|---|---|---|---|---|
| 6,713,938 | B2 * | 3/2004 | Nguyen | 310/309 |
| 6,909,221 | B2 * | 6/2005 | Ayazi et al. | 310/321 |
| 7,348,867 | B2 * | 3/2008 | Hattori | 333/186 |
| 2003/0222732 | A1 | 12/2003 | Matthaei | |
| 2004/0061564 | A1 | 4/2004 | Photiadis | |
| 2005/0017824 | A1 | 1/2005 | Hirabayashi | |
| 2005/0184003 | A1 | 8/2005 | Rodgers et al. | |
| 2006/0017523 | A1 | 1/2006 | Bhave | |
| 2006/0030277 | A1 | 2/2006 | Cyr et al. | |
| 2006/0273867 | A1 * | 12/2006 | Piazza et al. | 333/189 |
| 2007/0046398 | A1 * | 3/2007 | Nguyen et al. | 333/186 |
| 2007/0089519 | A1 * | 4/2007 | Hao et al. | 73/649 |
| 2007/0103258 | A1 * | 5/2007 | Weinstein et al. | 333/186 |

OTHER PUBLICATIONS

Yan et al.; "Single-Chip Multiple-Frequency VHF Low-Impedance Micro Piezoelectric Resonators"; IEEE Electron Device Letters, vol. 27, No. 4, Apr. 2006, pp. 246-248.*

Pang et al.; "Electrically Tunable and Temperature Compensated FBAR"; 2005 IEEE MTT-S International Microwave Symposium Digest, Jun. 12-17, 2005, pp. 1279-1282.*

Humad et al.; "High Frequency Micromechanical Piezo-On-Silicon Block Resonators"; 2003 Technical Digest IEEE International Electron Devices Meeting, IEDM '03 pp. 957-960, Dec. 8-10, 2003.*

International Search Report PCT/US2007/068018, mailed Mar. 28, 2008.

* cited by examiner

MEMS FILTER WITH VOLTAGE TUNABLE CENTER FREQUENCY AND BANDWIDTH

RELATED APPLICATIONS

This application claims priority to international PCT patent application PCT/US2007/068018 filed on May 2, 2007 which claims priority to U.S. provisional patent application 60/746,210 filed May 2, 2006 and entitled, "MEMS Filter with Voltage Tunable Center Frequency and Bandwidth." Therefore, this application also claims priority to the 60/746,210 provisional U.S. patent application as well. The 60/746,210 provisional patent application and the CT/US2007/068018 PCT patent application are hereby incorporated by reference in their entirety.

FIELD

The present invention relates to MEMS filters, and, more particularly, to voltage tunable MEMS filters.

BACKGROUND

High-Q microelectromechanical (MEMS) resonators are ideal replacements for conventional lumped LC components in radio frequency applications. Ladder and lattice filters built from MEMS resonators have better shape factor due to their inherent high mechanical quality factors (Q~1000-10,000) compared to quality factors of electrical LC components (Q~200). However, a major disadvantage of current MEMS filters is the lack of frequency and bandwidth tunability.

Therefore, what is needed is a MEMS filter with a tunable center frequency and bandwidth.

SUMMARY

A tunable MEMS filter is disclosed. The tunable filter has a substrate having a first isolated substrate area and a second isolated substrate area. The tunable filter also has first and second anchor points coupled to the substrate. The tunable filter further has a base coupled to the first and second anchor points by first and second coupling beams, respectively. The tunable filter has a dielectric layer coupled to the base. The tunable filter further has an input conductor coupled to the dielectric layer. The tunable light filter also has an output conductor coupled to the dielectric layer, wherein the first isolated substrate area is configured to receive a first substrate voltage with respect to the base; and the second isolated substrate area is configured to receive a second substrate voltage with respect to the base.

A method of tuning a center frequency and a bandwidth of a MEMS resonator filter is also disclosed. A first bias voltage is adjusted between a base layer and input and output conductor layers. A second bias voltage is adjusted between the base layer and isolated substrate areas below at least a portion of the base layer. The center frequency and the bandwidth of the MEMS resonator filter are determined until the adjustments to the first bias voltage and the second bias voltage provide a desired center frequency and a desired bandwidth, wherein adjusting the first bias voltage and the second bias voltage comprises: while holding the first bias voltage fixed, adjusting the second bias voltage such that the desired center frequency is obtained, noting the difference between the first bias voltage and the second bias voltage for the desired center frequency, adjusting the first bias voltage and the second bias voltage while maintaining the noted difference between the first bias voltage and the second bias voltage to obtain the desired bandwidth, making the first bias voltage and the second bias voltage the same, while keeping the second bias voltage the same as the first bias voltage, adjusting the first bias voltage to obtain the desired bandwidth, and while maintaining the first bias voltage, adjusting the second bias voltage to obtain the desired center frequency.

Figure 1:
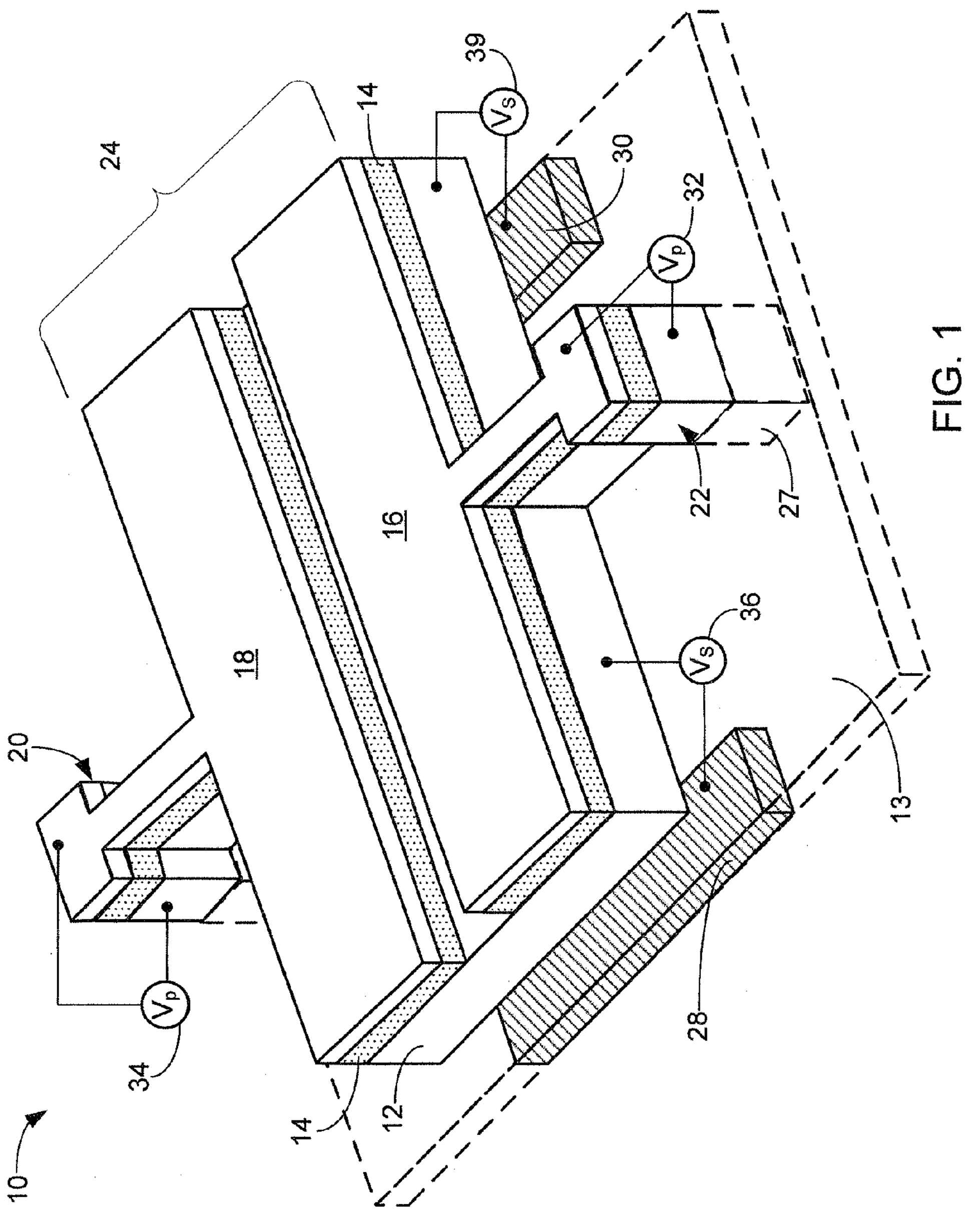
FIG. 1 is a perspective view of one embodiment of a MEMS resonator filter.

It will be appreciated that for purposes of clarity and where deemed appropriate, reference numerals have been repeated in the figures to indicate corresponding features, and that the various elements in the drawings have not necessarily been drawn to scale in order to better show the features of the invention.

DETAILED DESCRIPTION

FIG. 1 schematically illustrates a perspective view of an embodiment of a MEMS resonator filter 10 using dielectric transduction. The filter 10 has a base 12. The base 12 can be made, for example, from doped silicon, but in other embodiments, other conductive materials may be used. A dielectric layer 14 is coupled to the base 12. In the illustrated embodiment, the dielectric layer is divided into two portions, but in other embodiments, the dielectric layer 14 can be one continuous layer. A variety of materials can be used for the dielectric layer 14, such as, but not limited to, hafnium dioxide. The dielectric layer 14 may be deposited on the base 12. Coupled to the dielectric layer 14 are an input conductor 16 and an output conductor 18. Suitable material for the input and output conductors 16, 18 can include polysilicon. The base 12 is separated from a substrate 13 except at two anchor points 20 and 22 which are attached to the substrate 13. The substrate 13 is shown with dashed lines, since a variety of substrate shapes can be used while not changing the nature of the claimed invention. The main rectangular section 24 of the resonator 10 is supported by two tether points 26, one of which is visible in FIG. 4. Returning to FIG. 1, below the main rectangular section 24 are two isolated substrate areas 28 and 30 which are electrically isolated from the substrate 13. This electrical isolation can be from physical separation of the isolation substrate areas 28, 30 from the substrate 13, or it can be the result of doping the isolation substrate areas 28, 30 so that they are conductive in an otherwise non-conductive substrate 13, or the isolation substrate areas 28, 30 may be formed by deposition of conductive material on a non-conductive and/or insulated substrate 13.

In operation an input signal is applied to the input conductor 16 at the extension of the input conductor 16 over the input anchor point 22. The output signal is taken from the output conductor 18 at the extension of the output conductor 18 over the output anchor point 20. DC polarization voltages, $V_p$, 32 and 34 are applied between the base 12 and each of the input and output conductors 16 and 18, respectively. DC substrate bias voltages, $V_s$, 36 and 39 are applied between the base 12 and each of the two isolated substrate areas 28 and 30, respectively.

Figure 2:
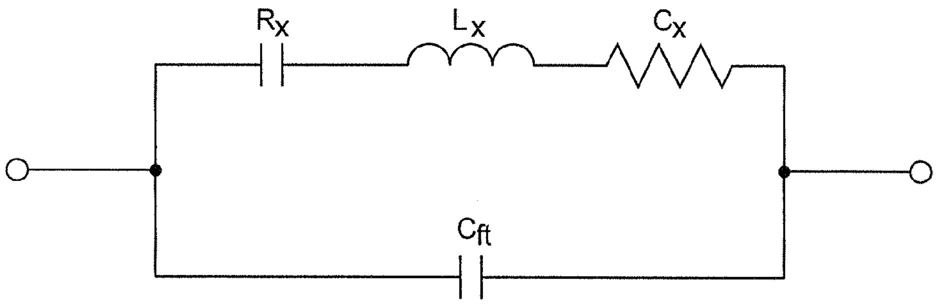
FIG. 2 is an equivalent circuit of the resonator shown in FIG. 1.

FIG. 2 is an equivalent circuit of the resonator 10 consisting of a series RLC circuit of $R_x$, $C_x$, and $L_x$ in parallel with a feedthrough capacitance $C_{ft}$. For a given transduction efficiency, η, $$\eta \equiv V_p \cdot \frac{\partial C}{\partial x} \tag{1}$$

$$R_x = \frac{b}{\eta^2} \tag{2}$$

$$C_x = \frac{\eta^2}{K} \tag{3}$$

$$L_x = \frac{M}{\eta^2} \tag{4}$$

where b, K and M denote damping constant, effective spring constant, and effective mass of the resonator, respectively. The feedthrough capacitance originates from electric field coupling from the input conductor 16 to the output conductor 18 in a two-port resonator and therefore is a function of the structure layout.

The series resonance frequency is given by:

$$\begin{aligned} \omega_{series} &= \frac{1}{\sqrt{L_x C_x}} \\ &= \frac{\eta}{\sqrt{M}} \cdot \frac{\sqrt{K}}{\eta} \\ &= \sqrt{\frac{K}{M}} \end{aligned} \tag{5}$$

A convenient expression for the parallel resonance frequency can be obtained through application of Taylor's expansion:

$$\begin{aligned} \omega_{parallel} &= \frac{1}{\sqrt{Lx\frac{CxCft}{Cx+Cft}}} \\ &= \omega_{series}\sqrt{1+\frac{Cx}{Cft}} \\ &= \omega_{series}\left(1+\frac{Cx}{2Cft}\right) \\ &= \sqrt{\frac{K}{M}}\left(1+\frac{\eta^2}{2C_{ft}K}\right) \\ &= \sqrt{\frac{K}{M}} + \frac{\eta^2}{2C_{f}t\sqrt{KM}} \\ &= \omega\text{series} + \frac{\eta^2}{2C_{ft}\sqrt{KM}} \end{aligned} \tag{6}$$

Substituting for η for parallel plate actuation:

$$\eta = \frac{V_p \varepsilon A}{d^2} \tag{7}$$

where ∈=dielectric permittivity, A=electrode area, and d=parallel plate gap size.

$$\begin{aligned} \omega_{parallel} &= \omega_{series} + \frac{\eta^2}{2C_{ft}\sqrt{KM}} \\ &= \omega_{series} + \frac{V_p^2\varepsilon^2A^2}{2d^4C_{ft}\sqrt{KM}} \\ &= \omega_{series} + \left(\frac{\varepsilon^2A^2}{2d^4C_{ft}\sqrt{M}}\right)\frac{V_p^2}{\sqrt{K}} \\ &= \omega_{series} + \beta\frac{V_p^2}{\sqrt{K}} \end{aligned} \tag{8}$$

Differentiating the above equation with respect to K, the following equations can be obtained:

$$\Delta\omega_{parallel} = \Delta\omega_{series} - \beta\frac{V_p^2\Delta K}{2K^{3/2}} \quad (9)$$

$$\Delta(\omega_{parallel} - \omega_{series}) = -\frac{\eta^2\Delta K}{4C_{ft}K\sqrt{KM}} \quad (10)$$

$$\Delta\omega_{series} = \frac{\Delta K}{2\sqrt{KM}} \quad (11)$$

$$\frac{\Delta(\omega_{parallel} - \omega_{series})}{\Delta\omega_{series}} = \frac{-\eta^2}{2KC_{ft}} = \frac{C_x}{2C_{ft}} \quad (12)$$

The ratio of $C_x$ to $C_{ft}$ is very small ($10^{-4}$-$10^{-2}$) for electrostatic actuation. This ratio is also sometimes expressed as the electromechanical coupling factor $k_e^2$. The pole-zero distance is effectively independent of series resonance frequency shifts.

Therefore, β can be redefined to absorb the K dependence in the parallel resonance frequency equation $$\omega_{paralel} = \omega_{series} + \beta V_p^2 \quad (13)$$

Therefore, the parallel resonance frequency is an offset from the series resonance frequency; the offset being directly proportional to the square of structural bias voltage.

Figure 3:
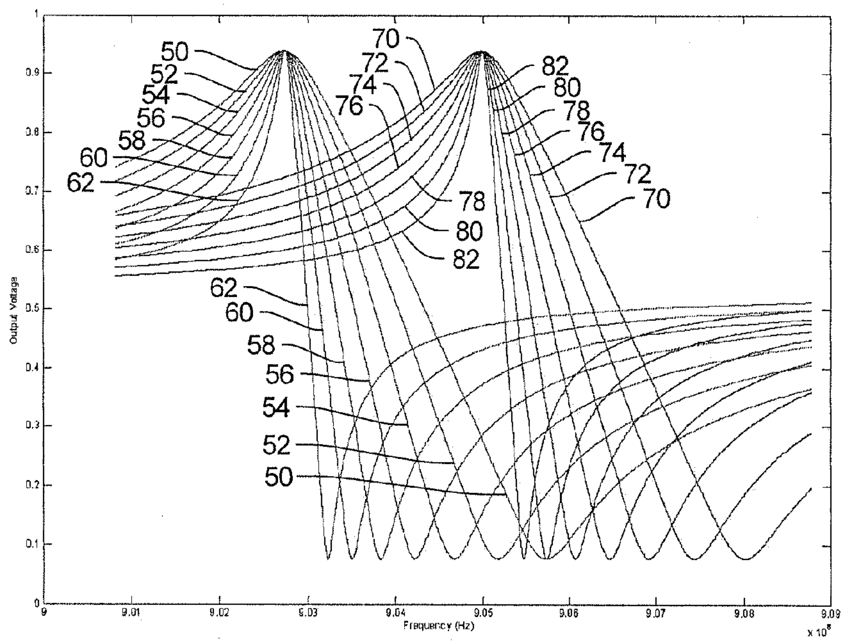
FIG. 3 is a plot of a simulation of the variation of the resonator transfer function with the applied structural bias voltage for two resonators with different series resonant frequencies.

An intuitive explanation of the voltage tunable parallel resonance frequency but voltage independent series resonance frequency is as follows. At series resonance, the feedthrough capacitance is negligible. $C_x$ is proportional to the square of $V_p$ but $L_x$ is inversely proportional to square of $V_p$. The effect of bias voltage cancels perfectly in the expression for series resonance frequency. At parallel resonance, however, the feedthrough capacitance $C_{ft}$ is in series with $C_x$, and it is no longer negligible. Since $C_{ft}$ is independent of $V_p$, the effect of bias voltage on the total capacitance and inductance do not cancel perfectly in the parallel resonance frequency expression. Hence the parallel resonance frequency is tunable through structural bias voltage. A simulation of the variation of resonator transfer function with $V_p$ shown as curves 50-62 and 70-82 for two resonators with different series resonance frequency is shown in FIG. 3. Note that the series resonance frequency does not change with $V_p$.

Figure 4:
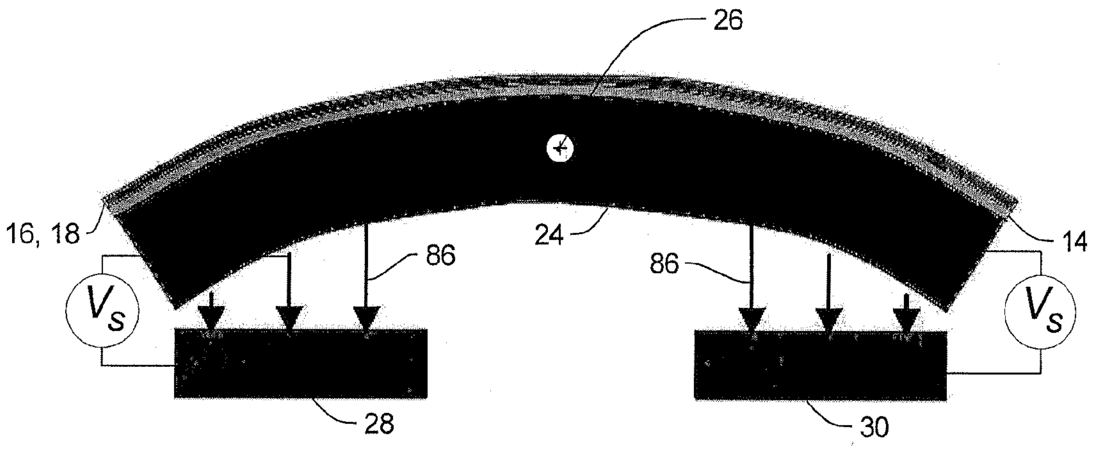
FIG. 4 is a depiction of the deformation of the resonator shown in FIG. 1 when tuned by orthogonal frequency tuning.

Tuning of the series resonance frequency can be done by varying the spring constant of the resonator. For high frequency RF applications, the resonator spring constant must be very high. Hence a large force in the direction of vibration is required to change the spring constant appreciably. One possible method to tune the series resonance frequency of a resonator is through Orthogonal Frequency Tuning. In Orthogonal Frequency Tuning, the resonator is bent by the electrostatic field 86 produced by $V_s$ in a direction orthogonal to the direction of vibration, as shown in FIG. 4, where the spring constant is much smaller. A much smaller force is required to time the spring constant and hence the series resonance frequency.

The precise operation of Orthogonal Frequency Tuning depends on the device geometry and mode of vibration. For example, consider a released thickness shear mode resonator suspended by quarter-wave tethers. A voltage $V_p$ is applied to the vibrating structure and a voltage $V_s$ is applied to the isolated substrate. The voltage difference $V_p$–$V_s$ causes an electrostatic force that deflects the structure towards the isolated substrate. Bending the structure changes its stiffness and hence its resonance frequency.

Figure 5:
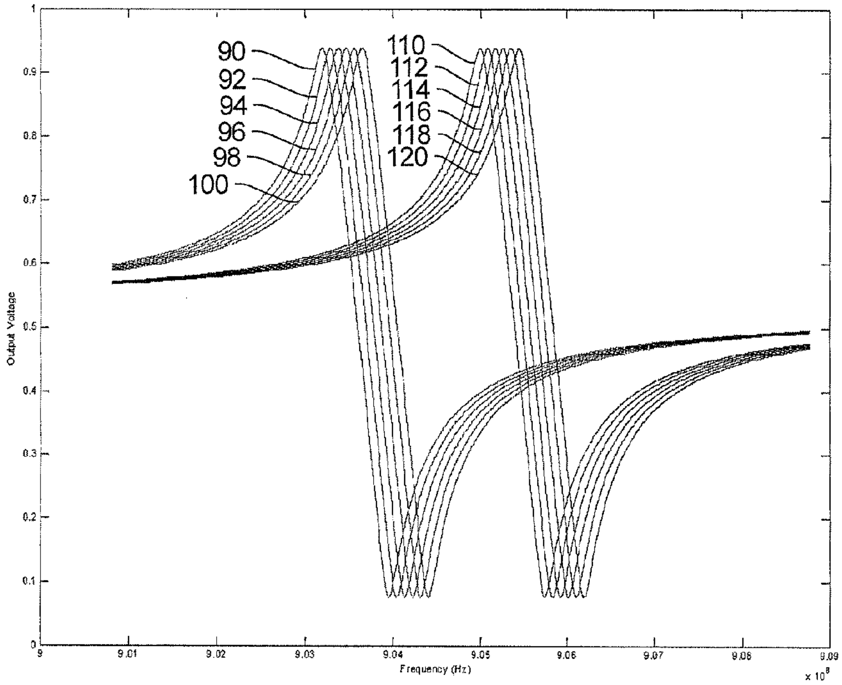
FIG. 5 is a plot of a simulation of the variation of the output transfer function with the voltage difference between the structural bias voltage and the substrate tuning voltage.
Figure 6A:
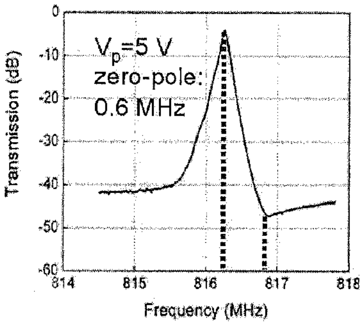
FIG. 6A is a plot of the transmission characteristics of a MEMS resonator according an embodiment the present invention for a first DC polarization voltage.
Figure 6B:
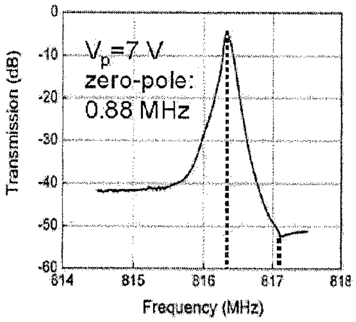
FIG. 6B is a plot of the transmission characteristics of a MEMS resonator according an embodiment the present invention for a second DC polarization voltage.
Figure 6C:
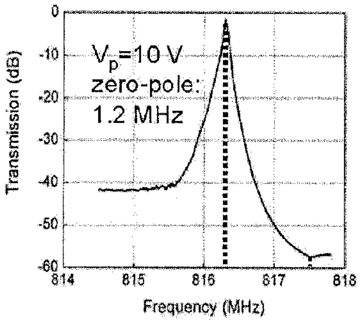
FIG. 6C is a plot of the transmission characteristics of a MEMS resonator according an embodiment the present invention for a third DC polarization voltage.
Figure 6D:
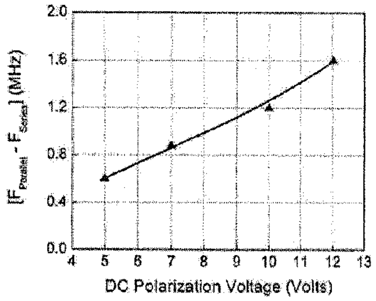
FIG. 6D is a plot of the pole-zero separation shown in FIGS. 6A-6C as a function of the DC polarization voltage.
Figure 7A:
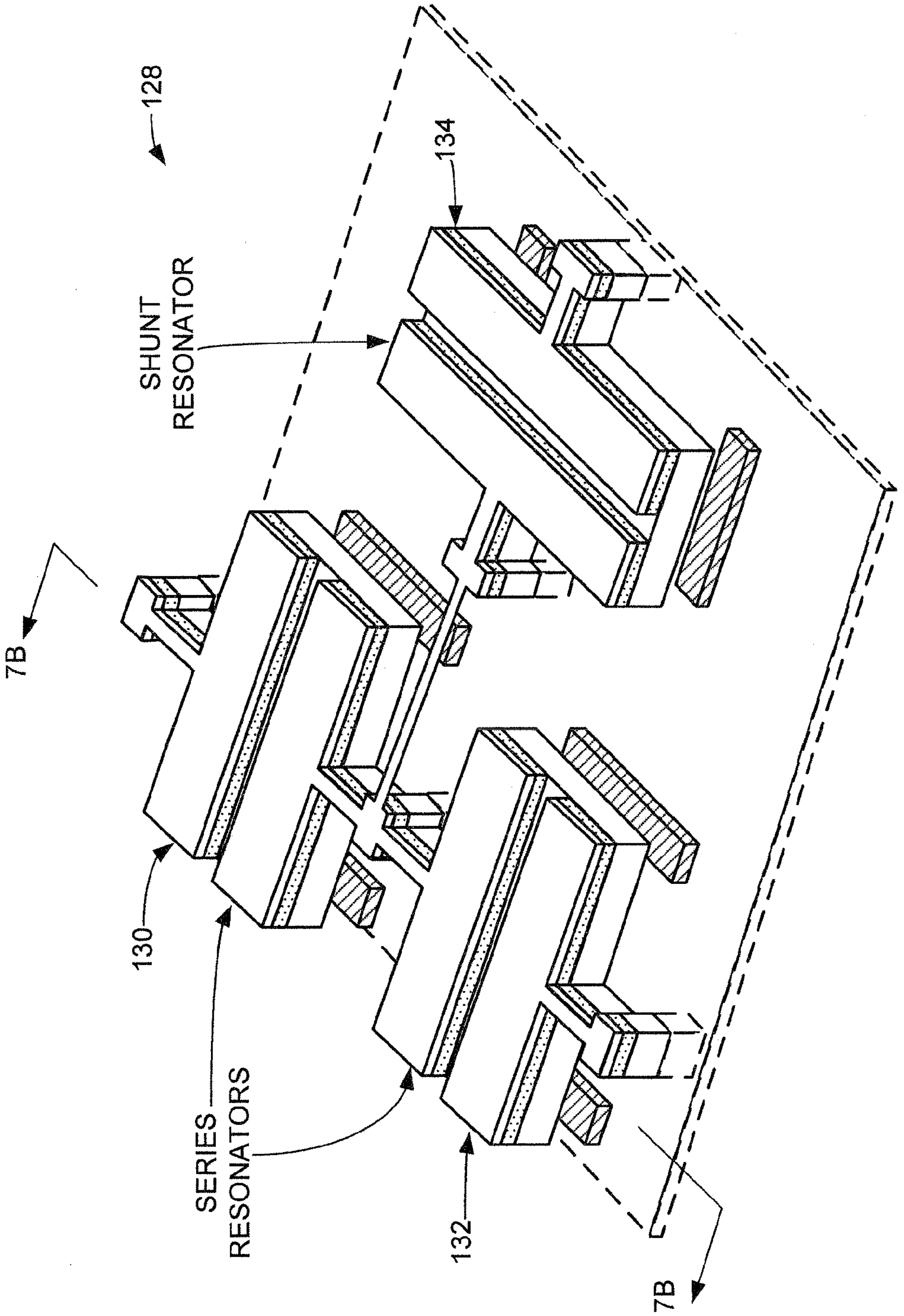
FIG. 7A is a perspective view of three of the resonators shown in FIG. 1 arranged in one embodiment of a ladder filter configuration.

FIG. 5 shows a simulation of the output transfer function as $V_p$-$V_s$ varies, $V_p$=5V in this simulation as shown by curves 90-100 and 110-120 for a series resonator in a ladder filter 128 shown in FIG. 7A and a shunt resonator in the ladder filter 128, respectively. The series resonance frequency has a tuning range of ~5 MHz. The shunt resonator is longer than the series resonator in one embodiment of the invention with a corresponding lower stiffness (therefore lower frequency). The transfer function for different $V_p$–$V_s$ can be determined experimentally. FIGS. 6A-6D are the results of one such experiment.

FIG. 6A is a plot of the transmission characteristics of a MEMS resonator 10 with a DC polarization voltage of 5 volts. FIG. 6B is shows the transmission characteristics with a 7 volt DC polarization voltage. FIG. 6C is shows the transmission characteristics with a 10 volt DC polarization voltage. FIG. 6D is a plot of the pole-zero separation shown in FIGS. 6A-6C as a function of the DC polarization voltage.

FIG. 7A schematically illustrates a perspective view of an embodiment of a multi-stage MEMS filter 128. In this embodiment, the multi-stage MEMS filter 128 is an embodiment of a ladder filter having two series resonators 130 and 132, and a shunt resonator 134. In a typical ladder filter configuration, $\omega_{parallel}$ of the shunt resonator 134 is matched with the $\omega_{series}$ of series resonators 130 and 132 and defines the filter center frequency ($f_c$). Filter bandwidth is determined by notches on either side of the passband and is 2× the pole-zero separation of the series and shunt resonators. As a result, it has been discovered that the key to tunable ladder filters is the ability to change the center frequency, $f_c$ and dynamically tune the pole-zero separation of the resonators.

Following are two embodiments of methods for tuning a center frequency and a bandwidth for a MEMS resonator filter.

Method 1

With $V_p$ fixed, change $V_s$ for both the series and shunt resonators such that the desired series and shunt center frequencies are obtained (Orthogonal Frequency Tuning).

Next, to keep the center frequencies, tune ($V_p$–$V_s$) separately for each resonator to obtain the desired $V_p$ for the required bandwidths (Parallel Resonance Frequency Tuning). Since ($V_p$–$V_s$) remains constant, the bending of the structure remains the same, and hence the center frequencies of the resonators do not change in this second step.

Method 2

Short $V_s$ and $V_p$ so that there is no orthogonal frequency tuning. Change the value of $V_p$ (and hence $V_s$) to obtain the desired bandwidth (Parallel Resonance Frequency Tuning).

Next, to obtain the center frequencies, tune $V_s$ separately for each resonator (Orthogonal Frequency Tuning).

Method 2 is relatively more straightforward compared to Method 1, since $V_p$ and $V_s$ are tuned independently. However, Method 1 is superior to Method 2 in terms of accuracy. In Method 2, the pole-zero distance actually changes a little when $V_s$ is applied (i.e. when center frequency shifts), although the errors introduced are small (on the order of $k_e^2\Delta f_{pole}$ from the analysis in Section 1). There are no such issues with Method 1.

Figure 7B:
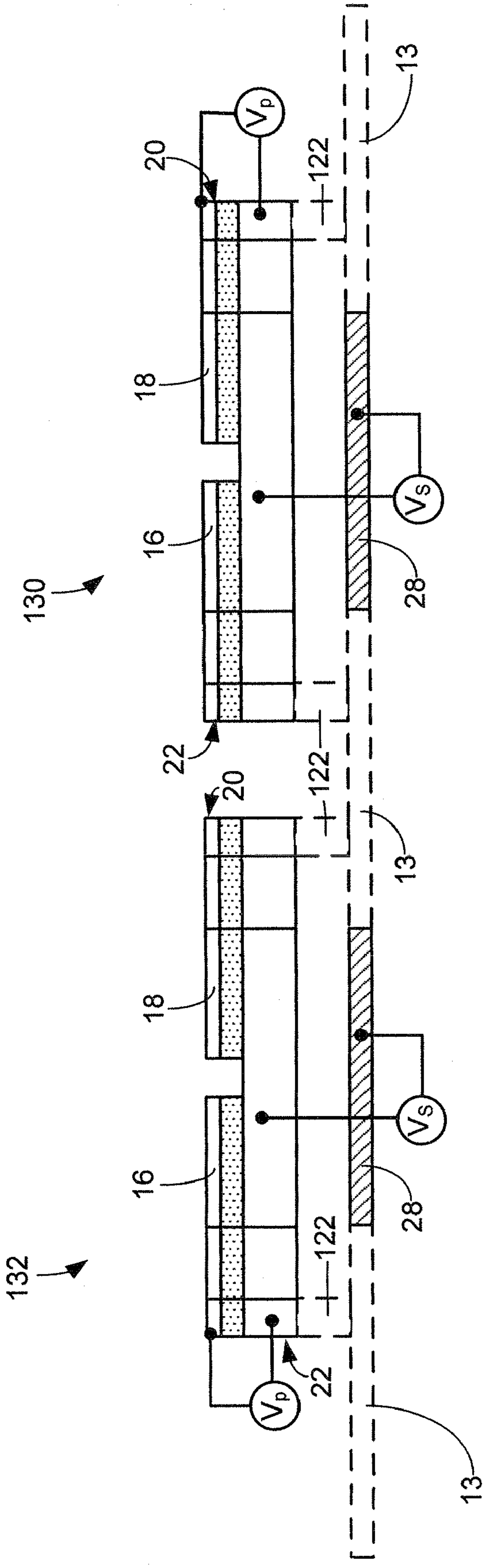
FIG. 7B is a cross-sectional view of two of the resonators shown in FIG. 7A.

FIG. 7B schematically illustrates a cross-sectional view of two of the resonators shown in FIG. 7A taken along cross-section line 7B-7B and looking in the direction indicated by the arrows on the end of line 7B-7B. Spacing or insulating layers 122 can be seen in the view of FIG. 7B. Such spacing or insulating layers 122 can be used to space and/or electrically isolate the base coupled to the anchor points 20, 22 from the substrate 13. Suitable material for the spacing or insulating layers 122 can be silicon-dioxide, which is easily formed on a silicon base. Other embodiments may use other materials or combinations of materials to space and/or insulate the anchor points from the substrate.

Figure 7C:
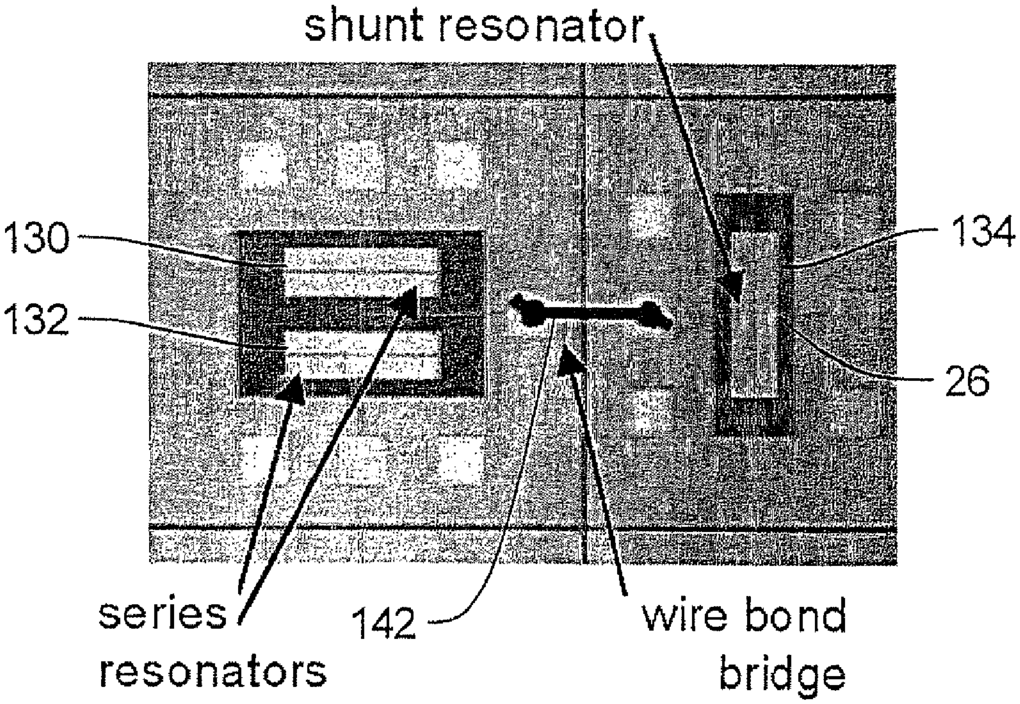
FIG. 7C is a top view from a Scanning Electron Microscope of the ladder filter shown in FIG. 7A.

FIG. 7C is a top view (from a Scanning Electron Microscope) of an embodiment of a ladder filter similar to the embodiment of the ladder filter 128 shown in FIG. 7A. A wire bond connection 142 is shown between the shunt resonator 134 and the two series resonators 130 and 132. Other embodiments may use different techniques to connect the resonators in the multi-stage filter structure. Additionally, one of the tether points 26 shown in FIG. 2 is identified in FIG. 7C.

Example 1

The following section illustrates one embodiment of the filter tuning methods through an example. Let $$\Delta f=(V_p-V_s)\times 10^5 \tag{14}$$

so that a 50V difference is required to tune the center frequency by 5 MHz. For purpose of this example, consider the following values for the equivalent RLC model of the series resonator.

$$C_x = 6.6087\times 10^{-17} V_p^2 F \tag{15}$$

$$L_x = \frac{4.6799\times 10^{-4}}{V_p^2} H \tag{16}$$

$$R_x = \frac{332.6365}{V_p^2} \Omega \tag{17}$$

$$C_0 = 9.9563\times 10^{-13} F \tag{18}$$

The shunt resonator is modeled as a 0.5% mass loaded series resonator to obtain the inherent frequency separation, so the only change is in the motional inductance.

$$L_x = \frac{4.7033\times 10^{-4}}{V_p^2} H \tag{19}$$

The resonance frequencies for the series and shunt resonator are 905 MHz and 902.74 MHz, the difference being 2.2582 MHz. The filter pass-band can start anywhere from 897.74 MHz to 902.74 MHz since orthogonal frequency tuning can only tune the frequency downwards (by 5 MHz in this example). With the additional requirement that the parallel resonance frequency of the shunt resonator coincide with the series resonance frequency of the series resonator, and a symmetric filter is desired, then the maximum (notch-to-notch) bandwidth is 2(905−897.74) MHz=14.52 MHz.

The simplest instance of a ladder filter is a T-network, with a shunt resonator sandwiched in between two series resonators. In the first example, a filter with first notch at 900 MHz and notch-to-notch bandwidth of 5 MHz is desired.

Using Method 1:

First, fix $V_p$ at 5V. To shift the center frequency of the shunt resonator to 900 MHz, a substrate bias=(5−27.4) V=−22.4V is applied to the shunt resonator. To shift the center frequency of the series resonator to 902.5 MHz, a substrate bias=(5−25) V=−20V is applied to the series resonator.

Next, the pole-zero separation is given by $$f_{pole}\frac{C_x}{2C_{ft}} = 2.5 \text{ MHz} \tag{20}$$

The required $V_p$ for the shunt resonator is 9.1486V. For the series resonator, the required $V_p$ is 9.1359V due to the slightly higher resonance frequency. To keep $V_p-V_s$ a constant, the shunt substrate bias becomes −22.4V+9.1486V=−13.2514V. The series substrate bias becomes −20V+9.1359V=−10.8641V.

Figure 8:
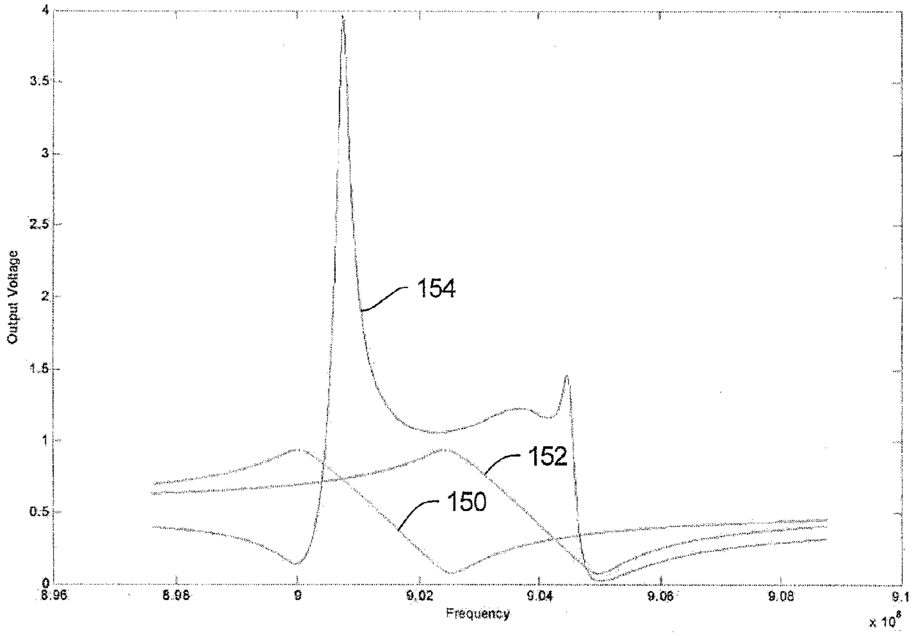
FIG. 8 is a plot of the calculated transfer function of a first example of a MEMS voltage tunable filter according to the present invention.

Using these values and a termination resistance of 400Ω, the output transfer function of the ladder filter as shown in FIG. 8 can be obtained through Kirchoff's Law. Note that the synthesis method gives the exact notch frequencies and bandwidth. In FIG. 8 the curve 150 is the calculated transfer function of the shunt resonator 134, curve 152 is the calculated transfer function of the series resonators 130 and 132, and curve 154 is the calculated transfer function of the ladder filter 128.

Example 2

Obtain a filter with first notch at 900 MHz and notch-to-notch bandwidth of 10 MHz.

Using Method 2

The required pole-zero separation is 5 MHz for both the series and shunt resonators. Using the equation $$f_{pole}\frac{C_x}{2C_{ft}} = 5 \text{ MHz} \tag{21}$$

$V_p$ for the series and shunt resonators are 12.9023V and 12.9184V respectively.

To move the first notch frequency to 900 MHz, $(V_p-V_s)$=27.4V. From the shunt $V_p$ obtained above, the shunt resonator substrate bias is (12.9184-27.4) V=−14.4816V. No orthogonal frequency tuning is needed for the series resonator because it is already at the right frequency at 905 MHz.

Figure 9:
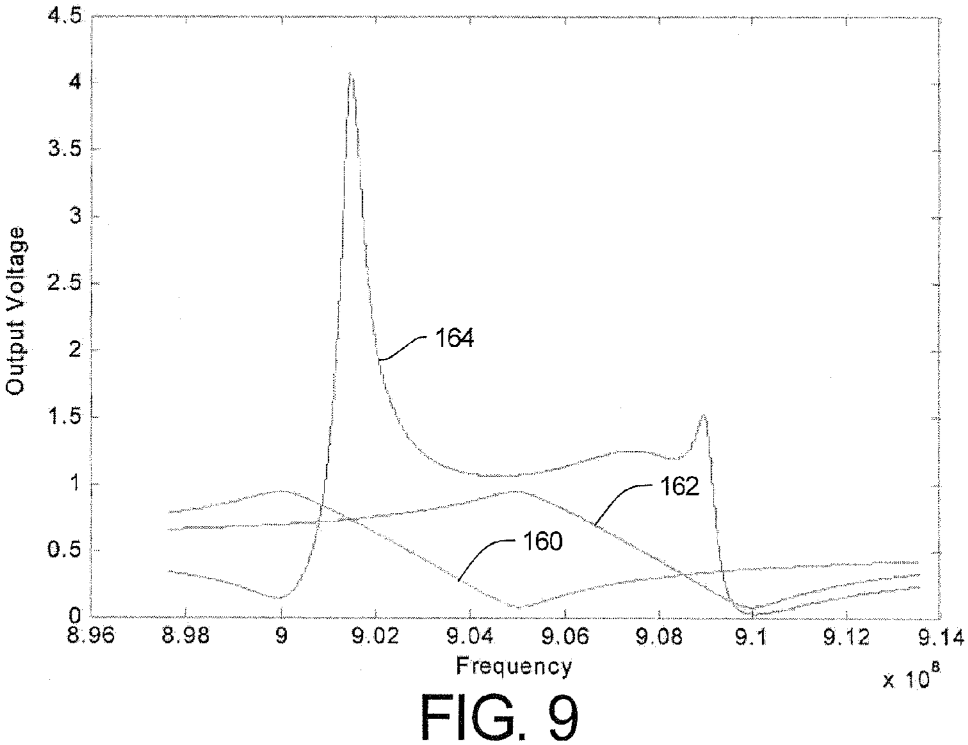
FIG. 9 is a plot of the calculated transfer function of a second example of a MEMS voltage tunable filter according to the present invention.

FIG. 9 shows results from the same ladder filter, with the single modification of structure bias $V_p$ and substrate bias $V_s$ for both series and shunt resonators as calculated above. There is only minor pass-band ripple degradation with larger bandwidth. In FIG. 9 the curve 160 is the calculated transfer function of the shunt resonator 134, curve 162 is the calculated transfer function of the series resonators 130 and 132, and curve 164 is the calculated transfer function of the ladder filter 128.

These two examples demonstrate the feasibility of center frequency tuning of approximately 0.5% and bandwidth tuning of 1% the center frequency through this real time bias voltage tuning scheme.

Example 3

Figure 10A:
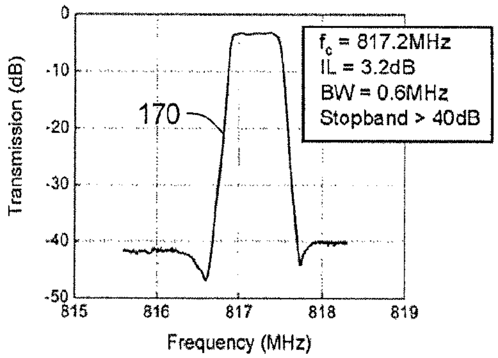
FIG. 10A is a plot of the transfer function of the filter shown in FIG. 7A with the structural bias voltage and the substrate tuning voltage of all of the resonators at 5 volts.
Figure 10B:
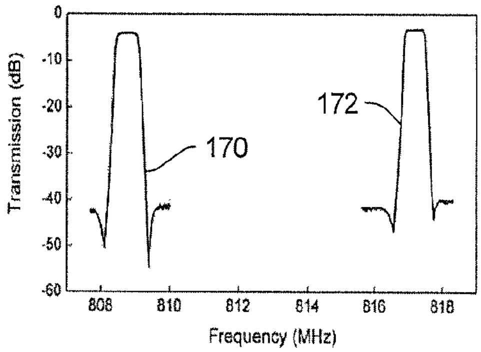
FIG. 10B is a plot showing the transfer function of FIG. 10A and the transfer function for a first set of structural bias voltages and substrate tuning voltages for the filter shown in FIG. 7A.
Figure 10C:
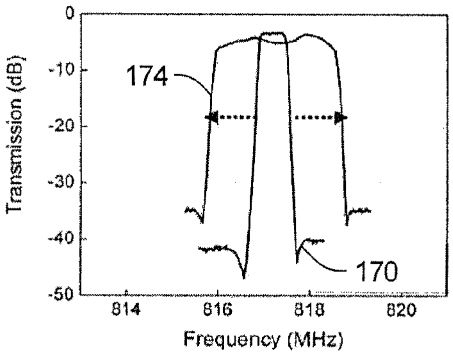
FIG. 10C is a plot showing the transfer function of FIG. 10A and the transfer function for a second set of structural bias voltages and substrate tuning voltages for the filter shown in FIG. 7A.
Figure 10D:
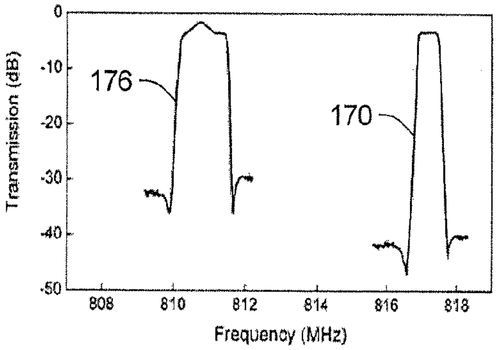
FIG. 10D is a plot showing the transfer function of FIG. 10A and the transfer function for a third set of structural bias voltages and substrate tuning voltages for the filter shown in FIG. 7A.

A ladder filter consisting of one shunt and two series resonators is fabricated in an SOI process and characterized. The resonators are 310 μm (and 300 μm)×100 μm×3.1 μm released bars topped with 20 mm hafnium dioxide as the dielectric transducer layer. With $V_p$=5 V yields a passband 170 with $f_c$=817.2 MHz, 0.6 MHz bandwidth and insertion loss (IL) of 3.2 dB as shown in FIG. 10A. By applying $V_{sub}$=15 V to all the resonators in the ladder, we are able to tune the filter center frequency from 817 MHz to 809 MHz, without affecting IL (3.5 dB) and shape factor (1.3) as shown by the passband 172 in FIG. 10B. FIG. 10C shows a passband 174 with bandwidth tuning from 0.6 MHz to 2.8 MHz while maintaining the center frequency at 817.2 MHz. However, the passband ripple increased from 0.4 dB to 1.8 dB. Finally, a combination of bandwidth and center frequency tuning is shown by the passband 176 in FIG. 10D. A passband with $f_c$=810.8 MHz and 1.4 MHz bandwidth is obtained.

Figure 11A:
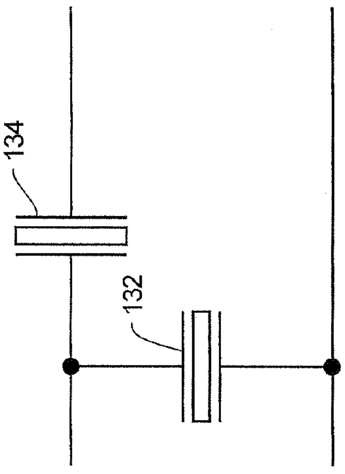
FIGS. 11A-11C schematically illustrate embodiments of ladder filters using MEMS resonators.
Figure 11B:
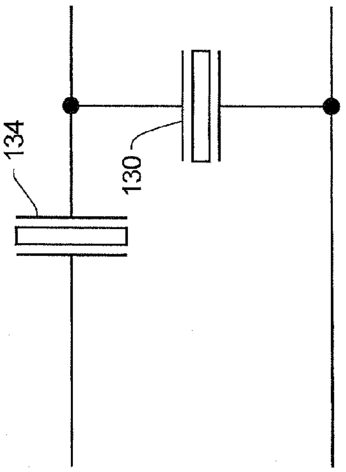
Figure 11C:
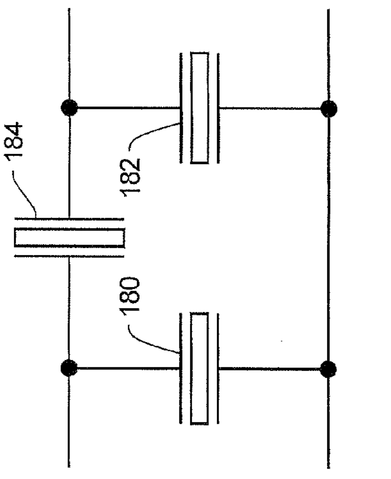

FIGS. 11A and 11B are sections of the ladder filter 128 shown in FIG. 7A with FIG. 11A having an input shunt resonator, such as resonator 132 in FIG. 7A, and the series resonator 134 of the ladder filter 128. FIG. 11B has the series resonator 134 and an output resonator such as resonator 130 of the ladder filter 134. FIG. 11C is a ladder filter with two shunt resonators 180 and 182 separated by a series resonator 184. All three of resonators shown in FIGS. 11A, 11B, and 11C are tuned in the manner discussed above with respect to the ladder filter 134 shown in FIG. 7.

Figure 12:
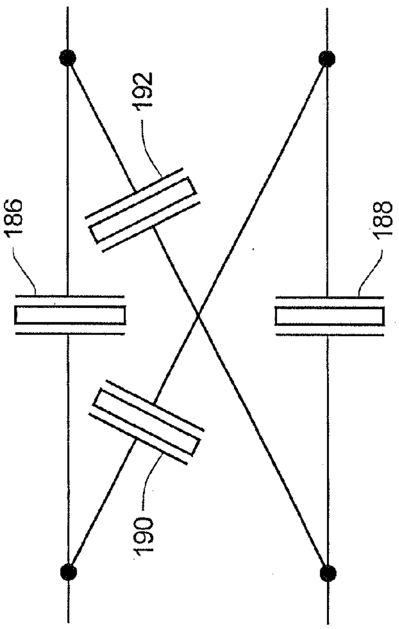
FIG. 12 schematically illustrates an embodiment of a lattice filter which uses MEMS resonators.

FIG. 12 is a schematic diagram of a tunable lattice filter with two series resonators 186 and 188 and two cross resonators 190 and 192. By fabricating all four resonators 186-192 with substantially identical static capacitance, their impedances will match very well off-resonance and thus the out-of-band attenuation for the filter will be very high.

Similar to ladder filter synthesis, the zeros of the resonators 186 and 188 are aligned with the poles of the resonators 190 and 192. The passband edges are defined by the outermost singularities of the lattice arm (i.e., the series resonance frequency of the resonators 190 and 192 and the parallel resonance frequency of the resonators 186 and 188). In order to obtain a lattice filter with tunable center frequency and bandwidth, the two tuning methods described above for the ladder filter can be applied, with the series resonators 186 and 188 being tuned similarly as the series resonators 130 and 132 in the ladder filter 128 shown in FIG. 7A, and the cross resonators 190 and 192 being tuned similarly as the shunt resonator 134 in the ladder filter 128.

Figure 13:
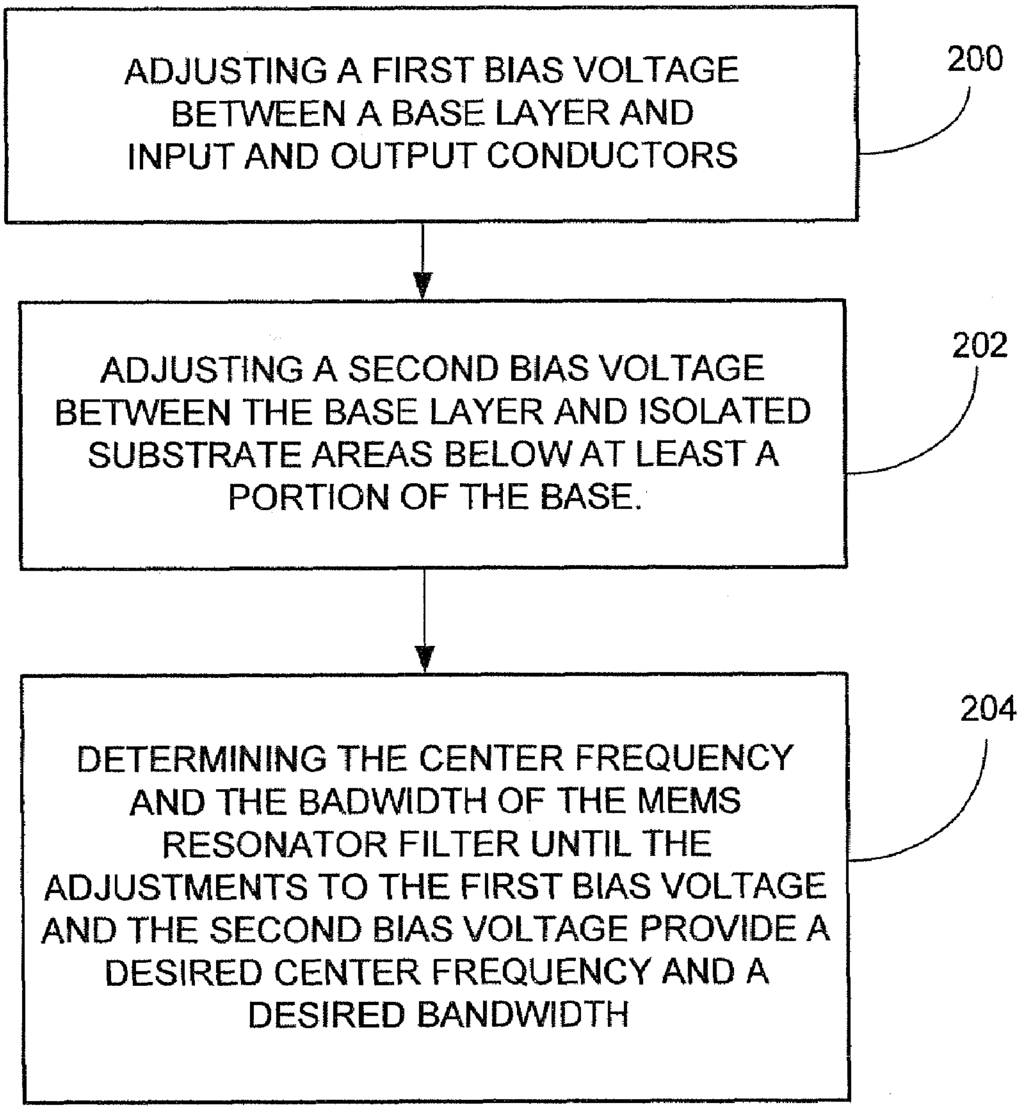
FIGS. 13-15 illustrate embodiments of methods for tuning the center frequency and the bandwidth of a MEMS resonator filter.

Based on the embodiments of tuning methods described above, FIG. 13 illustrates another, more generic tuning method which can be used with the disclosed system and its equivalents. A first bias voltage between a base layer and input and output conductor layers of a resonator is adjusted 200. A second bias voltage between the base layer and isolated substrate areas below at least a part of the base is also adjusted 202. The center frequency of the resonator filter and the bandwidth of the filter are determined 204 until the adjustments to the first bias voltage and the second bias voltage provide a desired center frequency and a desired bandwidth. While this method may not be as efficient as the methods previously described, given the control over the filter's center frequency and bandwidth provided by the first bias voltage and the second bias voltage, this method is still viable.

Figure 14:
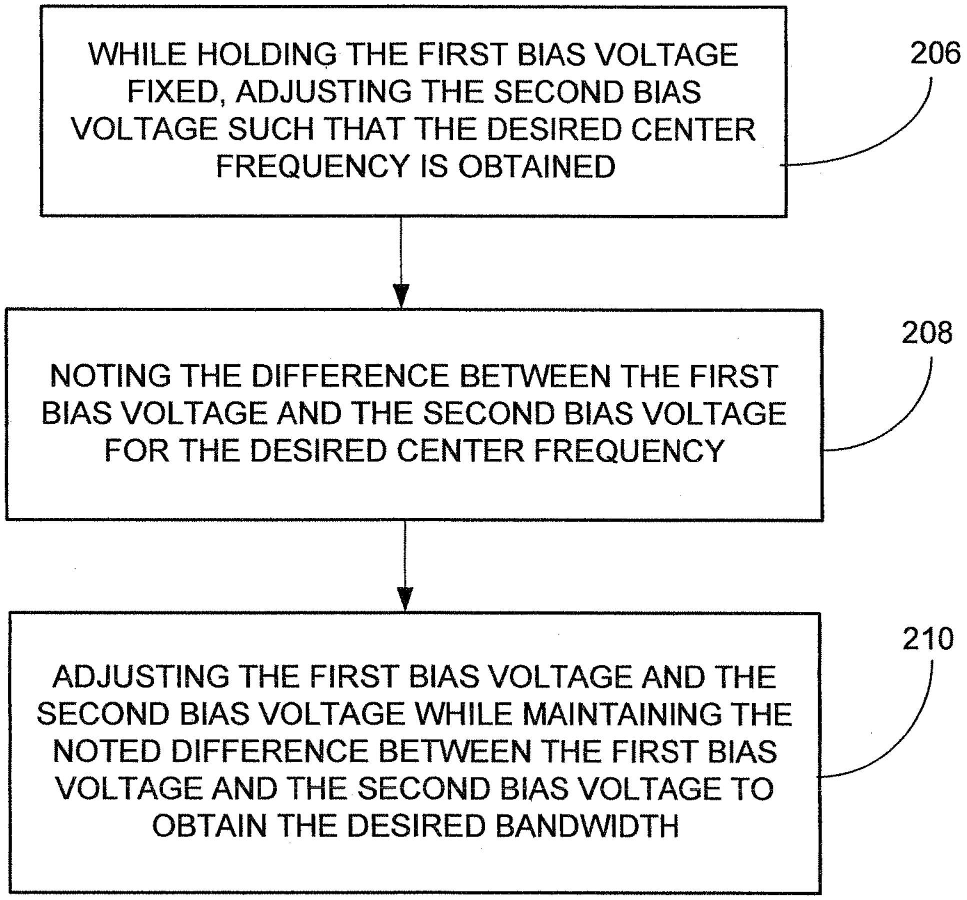

FIG. 14 illustrates another embodiment of a method of tuning a center frequency and a bandwidth of a MEMS resonator filter. A first bias voltage between a base layer and input and output layers of the filter is provided. A second bias voltage between the base layer and isolated substrate areas below at least a part of the base is provided. While holding the first bias voltage fixed, the second bias voltage is adjusted 206 such that the desired center frequency is obtained. The difference between the first bias voltage and the second bias voltages is noted 208 for the desired center frequency. Both the first bias voltage and the second bias voltage are adjusted 210 while maintaining the noted difference between the first bias voltage and the second bias voltage to obtain the desired bandwidth.

Figure 15:
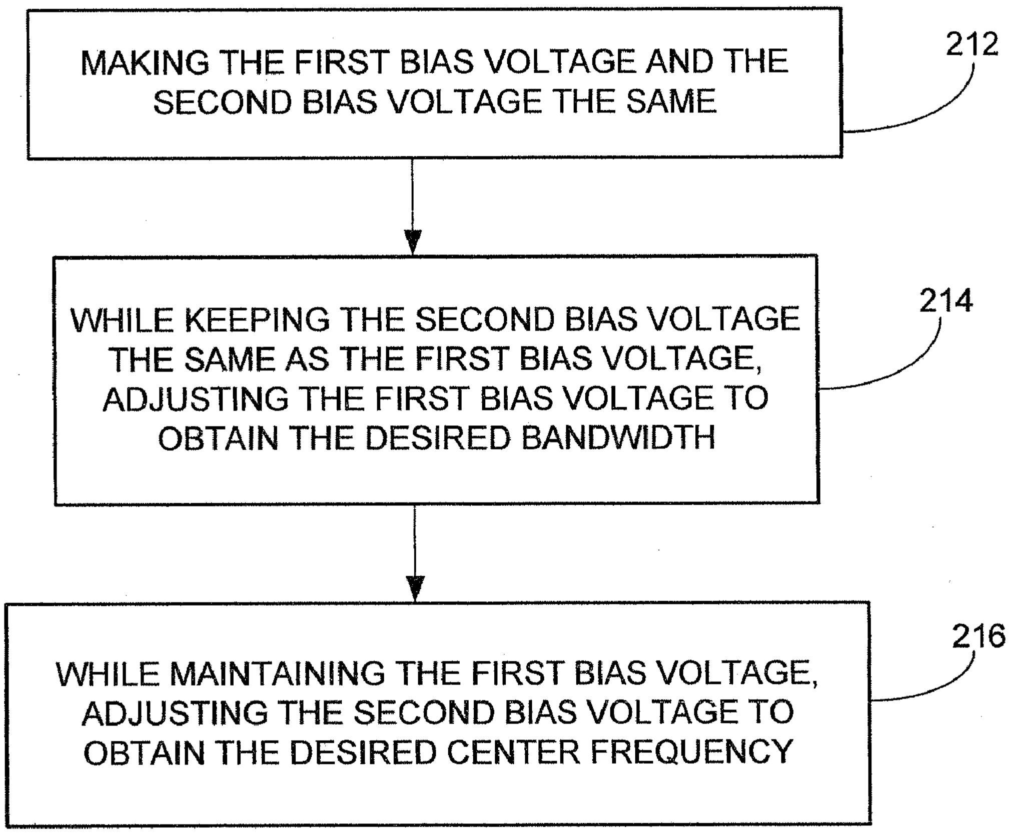

FIG. 15 illustrates a further embodiment of a method of tuning a center frequency and a bandwidth of a MEMS resonator filter. A first bias voltage between a base layer and input and output layers of the filter is provided. A second bias voltage between the base layer and isolated substrate areas below at least a part of the base is provided. The first bias voltage and the second bias voltage are made to be the same 212. While keeping the second bias voltage the same as the first bias voltage, the first bias voltage is adjusted 214 to obtain the desired bandwidth. While maintaining the first bias voltage, the second bias voltage is adjusted 216 to obtain the desired center frequency.

Those skilled in the art will understand that the basic filter types described herein can be combined in many different ways and can also combined with other electrical elements in which the structure of various sections of the filter can be fabricated using the resonators and tuning methods described herein.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state a means for performing a specified function or a step for performing a specified function should not be interpreted as a means or a step clause as specified in 35 U.S.C. 112.

What is claimed is:

1. A tunable MEMS filter comprising:

a substrate having a first isolated substrate area and a second isolated substrate area;

first and second anchor points coupled to the substrate;

a base coupled to the first and second anchor points by first and second coupling beams, respectively;

a dielectric layer coupled to the base;

an input conductor coupled to the dielectric layer; and an output conductor coupled to the dielectric layer;

wherein: the first isolated substrate area is configured to receive a first substrate voltage with respect to the base; and the second isolated substrate area is configured to receive a second substrate voltage with respect to the base.

2. The tunable MEMS filter of claim 1, wherein the first and second substrate voltages which the first and second isolated substrate areas are configured to receive with respect to the base are the same substrate voltage.

3. The tunable MEMS filter of claim 1, wherein: the input conductor is configured to receive a first planarization voltage with respect to the base; and the output conductor is configured to receive a second planarization voltage with respect to the base.

4. The tunable MEMS filter of claim 3, wherein the first and second planarization voltages which the input and output conductors are configured to receive with respect to the base are the same planarization voltage.

5. A tunable multistage MEMS filter comprising:

first, second, and third tunable MEMS filters, each comprising:

a substrate having a first isolated substrate area and a second isolated substrate area;

first and second anchor points coupled to the substrate;

a base coupled to the first and second anchor points by first and second coupling beams, respectively;

a dielectric layer coupled to the base;

an input conductor coupled to the dielectric layer; and an output conductor coupled to the dielectric layer;

wherein:

the input conductor of the first tunable MEMS filter is configured to receive an input signal;

the output conductor of the first tunable MEMS filter is coupled to the input conductor of the second tunable MEMS filter and the input conductor of the third tunable MEMS filter;

the output conductor of the second tunable MEMS filter is configured to provide an output signal;

the output conductor of the third tunable MEMS filter is configured to receive a ground;

the input conductor of the first tunable MEMS filter is configured to receive a first planarization voltage with respect to the base;

the output conductor of the first tunable MEMS filter is configured to receive a second planarization voltage with respect to the base;

the first isolated substrate area of the first tunable MEMS filter is configured to receive a first substrate voltage with respect to the base;

the second isolated substrate area of the first tunable MEMS filter is configured to receive a second substrate voltage with respect to the base;

the input conductor of the second tunable MEMS filter is configured to receive a third planarization voltage with respect to the base;

the output conductor of the second tunable MEMS filter is configured to receive a fourth planarization voltage with respect to the base;

the first isolated substrate area of the second tunable MEMS filter is configured to receive a third substrate voltage with respect to the base;

the second isolated substrate area of the second tunable MEMS filter is configured to receive a fourth substrate voltage with respect to the base;

the input conductor of the third tunable MEMS filter is configured to receive a fifth planarization voltage with respect to the base;

the output conductor of the third tunable MEMS filter is configured to receive a sixth planarization voltage with respect to the base;

the first isolated substrate area of the third tunable MEMS filter is configured to receive a fifth substrate voltage with respect to the base; and the second isolated substrate area of the third tunable MEMS filter is configured to receive a sixth substrate voltage with respect to the base.

6. The tunable multistage MEMS filter of claim 5, wherein: the first and second planarization voltages are the same; the first and second substrate voltages are the same; the third and fourth planarization voltages are the same; the third and fourth substrate voltages are the same; the fifth and sixth planarization voltages are the same; and the fifth and sixth substrate voltages are the same.

7. A voltage tunable MEMS filter comprising: a) two resonators using dielectric transduction connected in series for receiving an input signal at a first end of the two resonators connected in series, and providing an output signal at a second end of the two resonators connected in series; b) a shunt resonator using dielectric transduction connected between ground and a common node of the two resonators connected in series; c) a plurality of electrically isolated substrate regions lying below a portion of each of the resonators; d) wherein each of the resonators has a semiconductor layer having a dielectric layer on top thereof, and a plurality of polysilicon sections on top of the dielectric layer; and e) wherein each of the polysilicon layers and each of the isolated substrate regions are configured to receive a DC bias with respect to the semiconductor layer.

8. A method of tuning a center frequency and a bandwidth of a MEMS resonator filter, comprising:

adjusting a first bias voltage between a base layer and input and output conductor layers;

adjusting a second bias voltage between the base layer and isolated substrate areas below at least a portion of the base layer; and determining the center frequency and the bandwidth of the MEMS resonator filter until the adjustments to the first bias voltage and the second bias voltage provide a desired center frequency and a desired bandwidth;

wherein adjusting the first bias voltage and the second bias voltage comprises:

while holding the first bias voltage fixed, adjusting the second bias voltage such that the desired center frequency is obtained;

noting the difference between the first bias voltage and the second bias voltage for the desired center frequency; and adjusting the first bias voltage and the second bias voltage while maintaining the noted difference between the first bias voltage and the second bias voltage to obtain the desired bandwidth.

9. A method of tuning a center frequency and a bandwidth of a MEMS resonator filter, comprising:

adjusting a first bias voltage between a base layer and input and output conductor layers;

adjusting a second bias voltage between the base layer and isolated substrate areas below at least a portion of the base layer; and determining the center frequency and the bandwidth of the MEMS resonator filter until the adjustments to the first bias voltage and the second bias voltage provide a desired center frequency and a desired bandwidth;

wherein adjusting the first bias voltage and the second bias voltage comprises:

making the first bias voltage and the second bias voltage the same;

while keeping the second bias voltage the same as the first bias voltage, adjusting the first bias voltage to obtain the desired bandwidth; and while maintaining the first bias voltage, adjusting the second bias voltage to obtain the desired center frequency.

10. A method of tuning a center frequency and a bandwidth of a MEMS filter having multiple resonators, comprising: adjusting first bias voltages between a base layer and input and output conductor layers for each resonator; adjusting second bias voltages between the base layer and isolated substrate areas below at least a portion of the base layer for each resonator; and determining the center frequency and the bandwidth of the MEMS filter until the adjustments to the first bias voltages and the second bias voltages provide a desired center frequency and a desired bandwidth.

* * * * *

UNITED STATES PATENT AND TRADEMARK OFFICE

CERTIFICATE OF CORRECTION

PATENT NO. : 8,111,114 B2
APPLICATION NO. : 12/299341
DATED : February 7, 2012
INVENTOR(S) : Bhave et al.

It is certified that error appears in the above-identified patent and that said Letters Patent is hereby corrected as shown below:

On the Title Page:

Item (73) Assignee: Delete “Cornell Center for Technology, Enterprise & Commercialization” and insert -- Cornell University --

Signed and Sealed this
Third Day of April, 2012

David J. Kappos
*Director of the United States Patent and Trademark Office*